(12) United States Patent
Itoh et al.

(10) Patent No.: US 8,246,759 B2
(45) Date of Patent: Aug. 21, 2012

(54) SUBSTRATE PROCESSING APPARATUS, SUBSTRATE PROCESSING METHOD, AND PROGRAM STORAGE MEDIUM

(75) Inventors: Norihiro Itoh, Koshi (JP); Jiro Higashijima, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 470 days.

(21) Appl. No.: 12/474,336

(22) Filed: May 29, 2009

(65) Prior Publication Data

US 2009/0297705 A1 Dec. 3, 2009

(30) Foreign Application Priority Data

Jun. 3, 2008 (JP) .................................. 2008-145736
Jun. 3, 2008 (JP) .................................. 2008-145744

(51) Int. Cl.
*B08B 3/00* (2006.01)
(52) U.S. Cl. ......................................... 134/33; 134/902
(58) Field of Classification Search ........................ None
See application file for complete search history.

(56) References Cited

U.S. PATENT DOCUMENTS 5,706,843 A 1/1998 Matsuo
7,139,638 B2 * 11/2006 Nakajima et al. ............. 700/218

FOREIGN PATENT DOCUMENTS

| JP | 06-097137 | | 4/1994 |
|---|---|---|---|
| JP | 08-257469 | A1 | 10/1996 |
| JP | 09-167751 | A1 | 6/1997 |
| JP | 2002-319563 | A1 | 10/2002 |
| JP | 2008-004879 | A1 | 1/2008 |

* cited by examiner

*Primary Examiner* — Michael Barr
*Assistant Examiner* — Jason Ko
(74) *Attorney, Agent, or Firm* — Burr & Brown (57) ABSTRACT

There is provided a substrate processing apparatus capable of stably holding a substrate and properly processing the substrate. The substrate processing apparatus is an apparatus that processes a substrate while rotating the substrate, with a place surface of the substrate being oriented in a horizontal direction. The substrate processing apparatus comprises a table including a rotatable base plate having a plurality of projecting members projected outward, and a rotation driving mechanism that rotates the base plate. The table can rotatably hold the substrate such that the projecting members contact the substrate from below with a gap formed between the substrate and the table. The substrate processing apparatus further comprises a pressure adjusting apparatus including a suction duct line having one end thereof being opened to the gap, and a suction mechanism connected to the other end of the suction duct line.

20 Claims, 4 Drawing Sheets

SUBSTRATE PROCESSING APPARATUS, SUBSTRATE PROCESSING METHOD, AND PROGRAM STORAGE MEDIUM

CROSS REFERENCE TO RELATED APPLICATIONS

This application is based upon and claims the benefit of priority from the prior Japanese Patent Application No. 2008-145736 filed on Jun. 3, 2008, and Japanese Patent Application No. 2008-145744 filed on Jun. 3, 2008, the entire contents of which are incorporated herein by reference.

BACKGROUND OF THE INVENTION

1. Field of the Invention

The present invention relates to a substrate processing apparatus and a substrate processing method, which are configured to process a substrate while rotating the substrate, with a plate surface thereof being oriented substantially along a horizontal direction. In addition, the present invention relates to a program storage medium storing a program for performing the substrate processing method configured to process a substrate while rotating the substrate, with a plate surface thereof being oriented substantially along a horizontal direction.

2. Description of Related Art

As disclosed in JP6-097137A, for example, there has been conventionally, generally known a substrate processing apparatus and a substrate processing method that process a substrate while rotating the substrate, with the substrate being held such that a plate surface thereof is oriented along a horizontal direction. In such a process, it is necessary to rotatably hold a substrate in the processing apparatus. In particular, when there is processed a discoid substrate, such as a semiconductor wafer (hereinafter simply referred to also as "wafer"), which is likely to flutter (jump) during being rotated because of its thin plate-like shape and is likely to slide (shift) with respect to the processing apparatus during being rotated because of its substantially circular outer contour, the substrate is required to be stably held.

In many instances, a process, which includes loading of the substrate into the processing apparatus and unloading of the substrate from the processing apparatus, to a substrate with the use of a substrate processing apparatus is automatically performed. Thus, it is necessary not only to examine (check) whether the processing apparatus itself works normally or not, but also examine (check) a state of a substrate, i.e., whether a substrate to be processed is brought into the apparatus or not, whether a support position of the substrate is normal or not, and whether a holding state of the substrate is normal or not. Particularly when there is processed a substrate, such as a semiconductor wafer, which is likely to flutter (jump) because of its thin plate-like shape and is likely to slide (shift) during being rotated with respect to a processing apparatus because of its discoid shape, it is required to monitor a state of the substrate with a high precision.

SUMMARY OF THE INVENTION

The first aspect of the substrate processing apparatus for processing a substrate while rotating the substrate with a plate surface of the substrate being oriented substantially in a horizontal direction of the present invention, comprises: a table including a rotatable base plate having projecting members projected upward, the table being capable of supporting a substrate such that the projecting members contact the substrate from below with a gap being formed between the substrate and the table; a rotation driving mechanism configured to rotate the base plate; and a pressure adjusting apparatus including a suction duct line having one end thereof being opened to the gap and a suction mechanism connected to the suction duct line.

The second aspect of the substrate processing apparatus for processing a substrate while rotating the substrate with a plate surface of the substrate being oriented substantially in a horizontal direction of the present invention, comprises: a table including a rotatable base plate having projecting members projected upward, the table being capable of supporting a substrate such that the projecting members contact the substrate from below with a gap being formed between the substrate and the table; a rotation driving mechanism configured to rotate the base plate; and a pressure monitoring apparatus including a pressure measuring duct line having one end thereof being opened to the gap and a pressure sensor connected to the pressure measuring duct line.

The first aspect of the substrate processing method for processing a substrate while rotating the substrate with a plate surface of the substrate being oriented substantially in a horizontal direction of the present invention, comprises: a supporting step in which a substrate is placed on projecting members projected upward of a table, and the substrate is supported with a gap formed between the substrate and the table; an accelerating step in which the supported substrate is started to be rotated, and a rotational velocity of the substrate is accelerated; and a processing step in which the substrate is processed while the substrate is being rotated, wherein a suction of an atmosphere of the gap is performed by a pressure adjusting apparatus including a suction duct line having one end thereof being opened to the gap and a suction mechanism connected to the suction duct line, for at least a certain period during a duration from when the supporting step is finished until when the processing step is finished.

The second aspect of the substrate processing method for processing a substrate while rotating the substrate with a plate surface of the substrate being oriented substantially in a horizontal direction of the present invention, comprises: a supporting step in which a substrate is placed on projecting members projected upward of a table, and the substrate is supported with a gap formed between the substrate and the table; and a processing step in which the substrate is processed while the substrate is being rotated, wherein a state of the substrate is examined based on a pressure measured by a pressure monitoring apparatus including a pressure measuring duct line having one end thereof being opened to the gap and a pressure sensor connected to the pressure measuring duct line, for at least a certain period during a duration from when the supporting step is finished until when the processing step is finished.

The first aspect of the program storage medium of the present invention is executable by a control device for controlling a substrate processing apparatus, upon execution of the program by the control device, there is performed a method for processing a substrate by the substrate processing apparatus, the substrate processing method for processing a substrate while rotating the substrate, with a plate surface of the substrate being oriented substantially in a horizontal direction, the substrate processing method comprising: a supporting step in which a substrate is placed on projecting members projected upward of a table, and the substrate is supported with a gap formed between the substrate and the table; an accelerating step in which the supported substrate is started to be rotated, and a rotational velocity of the substrate is accelerated; and a processing step in which the substrate is processed while the substrate is being rotated, wherein a suction of an atmosphere of the gap is performed by a pressure adjusting apparatus including a suction duct line having one end thereof being opened to the gap, and a suction mechanism connected to the suction duct line, for at least a certain period during a duration from when the supporting step is finished until when the processing step is finished.

The second aspect of the program storage medium of the present invention is executable by a control device for controlling a substrate processing apparatus, upon execution of the program by the control device, there is performed a method for processing a substrate by the substrate processing apparatus, the substrate processing method for processing a substrate while rotating the substrate, with a plate surface of the substrate being oriented substantially in a horizontal direction, the substrate processing method comprising: a supporting step in which a substrate is placed on projecting members projected upward of a table, and the substrate is supported with a gap formed between the substrate and the table; and a processing step in which the substrate is processed while the substrate is being rotated, wherein a state of the substrate is examined based on a pressure measured by a pressure monitoring apparatus including a pressure measuring duct line having one end thereof being opened to the gap and a pressure sensor connected to the pressure measuring duct line, for at least a certain period during a duration from when the supporting step is finished until when the processing step is finished.

DETAILED DESCRIPTION OF THE INVENTION

A first embodiment of the substrate processing apparatus is configured to process a substrate while rotating the substrate, with a plate surface of the substrate being oriented substantially in a horizontal direction, and the first embodiment of the substrate processing apparatus comprises: a table including a rotatable base plate having projecting members projected upward, the table being capable of supporting a substrate such that the projecting members contact the substrate from below with a gap being formed between the substrate and the table; a rotation driving mechanism configured to rotate the base plate; and a pressure adjusting apparatus including a suction duct line having one end thereof being opened to the gap, and a suction mechanism connected to the suction duct line. According to the first embodiment of the substrate processing apparatus, there can be provided the substrate processing apparatus which is capable of stably holding a substrate and properly processing the substrate.

The following concrete embodiments (forms, structures, manners, and so on) can be applied to the first substrate processing apparatus.

The first embodiment of the substrate processing apparatus may further comprises a control device connected to the rotation driving mechanism and the pressure adjusting apparatus, wherein, the control device may be configured to control a suction performed by the pressure adjusting apparatus, based on at least a rotational velocity of the base plate rotated by the rotation driving mechanism, when the base plate is driven in rotation. In the first embodiment of the substrate processing apparatus, the control device may be configured to perform the suction by the pressure adjusting apparatus when the rotational velocity of the base plate rotated by the rotation driving mechanism is not more than a preset rotational velocity or is below the preset rotational velocity, and the control device may be configured to stop the suction by the pressure adjusting apparatus when the rotational velocity of the base plate is over a preset rotational velocity or is not less than the preset rotational velocity.

In addition, the first embodiment of the substrate processing apparatus may further comprise a pressure monitoring apparatus including a pressure measuring duct line having one end thereof being opened to the gap and a pressure sensor connected to the pressure measuring duct line. Further, the first embodiment of the substrate processing apparatus may further comprise a control device connected to the pressure monitoring apparatus, wherein the control device may be configured to examine a state of the substrate, based on a pressure in the gap which is measured by the pressure monitoring apparatus. In addition, in the first embodiment of the substrate processing apparatus, while the base plate is rotated, the control device may be configured to judge that there is a trouble, when the pressure measured by the pressure monitoring apparatus is over a predetermined value that is determined based on at least a rotational velocity of the substrate at the time the pressure being measured, or is not less than the predetermined value. Alternatively, in the first embodiment of the substrate processing apparatus, the control device may be configured to judge that there is a trouble, when the pressure measured by the pressure monitoring apparatus is over a predetermined value or is not less than the predetermined value which is determined based on at least whether the substrate is rotated or not at the time the pressure being measured, and, if rotated, a rotational velocity of the substrate at the time the pressure being measured.

Further, in the first embodiment of the substrate processing apparatus, the base plate may have an opening formed in a position opposed to the substrate, and the table further may include an elevating plate positioned in the opening of the base plate, and the substrate processing apparatus may further comprise: a rotating shaft member that is connected to the base plate and is connected to the rotation driving mechanism such that the rotation driving mechanism can rotate the rotating shaft member, the rotating shaft member having a hollow part in communication with the opening of the base plate; an elevating shaft member extended slidably with respect to the rotating shaft member in the hollow part of the rotational shaft member, the elevating shaft member being connected to the elevating plate; and an elevation driving mechanism connected to the elevating shaft member such that the elevation driving mechanism can move the elevating shaft member upward and downward. In the first embodiment of the substrate processing apparatus, the suction duct line may be extended in the elevating shaft member, and the one end of the suction duct line may be opened to the gap positioned between the elevating plate and the substrate. In addition, in the first embodiment of the substrate processing apparatus, the pressure measuring duct line may be extended in the elevating shaft member, and the one end of the pressure measuring duct line may be opened to the gap positioned between the elevating plate and the substrate.

Further, the first embodiment of the substrate processing apparatus may further comprise a rotating shaft member that is connected to the base plate and that is connected to the rotation driving mechanism such that the rotation driving mechanism can rotate the rotating shaft member. In the first embodiment of the substrate processing apparatus, the suction duct line may be extended in the rotating shaft member, and the one end of the suction duct line may be opened to the gap positioned between the base plate and the substrate. In addition, in the first embodiment of the substrate processing apparatus, the pressure measuring duct line may be extended in the rotating shaft member, and the one end of the pressure measuring duct line may be opened to the gap positioned between the base plate and the substrate.

Furthermore, in the first embodiment of substrate processing apparatus, each of the projecting members may include: a support part that is configured to contact a peripheral part of the substrate from below; and a restriction part projected further upward than the support part so as to be positioned on a lateral side of the peripheral part of the substrate.

A second embodiment of the substrate processing apparatus is configured to process a substrate while rotating the substrate, with a plate surface of the substrate being oriented substantially in a horizontal direction, and the second embodiment of the substrate processing apparatus comprises: a table including a rotatable base plate having projecting members projected upward, the table being capable of supporting a substrate such that the projecting members contact the substrate from below with a gap being formed between the substrate and the table; a rotation driving mechanism configured to rotate the base plate; and a pressure monitoring apparatus including a pressure measuring duct line having one end thereof being opened to the gap and a pressure sensor connected to the pressure measuring duct line. According to the second embodiment of the substrate processing apparatus, a state of the substrate can be examined readily and exactly. The aforementioned concrete embodiments (forms, structures, manners, and so on), which can be applied to the first embodiment of the substrate processing apparatus, can be also applied to the second embodiment of the substrate processing apparatus.

A first embodiment of the substrate processing method for processing a substrate while rotating the substrate, with a plate surface of the substrate being oriented substantially in a horizontal direction, comprises: a supporting step in which a substrate is placed on projecting members projected upward of a table, and the substrate is supported with a gap formed between the substrate and the table; an accelerating step in which the supported substrate is started to be rotated, and a rotational velocity of the substrate is accelerated; and a processing step in which the substrate is processed while the substrate is being rotated, wherein a suction of an atmosphere of the gap is performed by a pressure adjusting apparatus including a suction duct line having one end thereof being opened to the gap and a suction mechanism connected to the suction duct line, for at least a certain period during a duration from when the supporting step is finished until when the processing step is finished. According to the first embodiment of the substrate processing method, there can be provided the substrate processing method which is capable of stably holding a substrate and properly processing the substrate.

The following concrete embodiments (forms, structures, manners, and so on) can be applied to the first embodiment of the substrate processing method.

In the first embodiment of the substrate processing method, the suction by the pressure adjusting apparatus may be performed in the accelerating step until at least the rotational velocity of the substrate becomes not less than a preset rotational velocity or exceeds the preset velocity.

In addition, the first embodiment of the substrate processing method may further comprises a holding step in which the suction of the atmosphere of the gap is performed by the pressure adjusting apparatus so that the substrate is sucked toward the table and held thereon, wherein the holding step may be performed after the supporting step and before the accelerating step.

Further, in the first embodiment of the substrate processing method, the suction by the pressure adjusting apparatus may be stopped, for at least a certain period during a duration of the processing step.

Furthermore, in the first embodiment of the substrate processing method, the processing step may include a plurality of processing steps for performing different processes to the rotating substrate and the suction by the pressure adjusting apparatus may be stopped during at least one of the plurality of processing steps.

Still further, in the first embodiment of the substrate processing method, the suction by the pressure adjusting apparatus may be stopped in the processing step during when the rotational velocity of the substrate is not less than a preset rotational velocity or is over the preset rotational velocity.

Still furthermore, in the first embodiment of the substrate processing method, a state of the substrate may be examined based on a pressure measured by a pressure monitoring apparatus including a pressure measuring duct line having one end thereof being opened to the gap and a pressure sensor connected to the pressure measuring duct line, for at least a certain period during a duration from when the supporting step is finished until when the processing step is finished. In the first embodiment of the substrate processing method, the examination of the state of the substrate may be judged that there is a trouble, when the pressure measured by the pressure monitoring apparatus is over a predetermined value that is determined based on at least the rotational velocity of the substrate at the time the pressure being measured, or is not less than the predetermined value.

A second embodiment of the substrate processing method for processing a substrate while rotating the substrate, with a plate surface of the substrate being oriented substantially in a horizontal direction, the substrate processing method comprising: a supporting step in which a substrate is placed on projecting members projected upward of a table, and the substrate is supported with a gap formed between the substrate and the table; and a processing step in which the substrate is processed while the substrate is being rotated, wherein a state of the substrate is examined based on a pressure measured by a pressure monitoring apparatus including a pressure measuring duct line having one end thereof being opened to the gap and a pressure sensor connected to the pressure measuring duct line, for at least a certain period during a duration from when the supporting step is finished until when the processing step is finished. According to the second embodiment of the substrate processing method, a state of the substrate can be examined readily and exactly. The aforementioned concrete embodiments (forms, structures, manners, and so on), which can be applied to the first embodiment of the substrate processing method, can be also applied to the second embodiment of the substrate processing method.

A first embodiment of the program storage medium is executable by a control device for controlling a substrate processing apparatus, upon execution of the program by the control device, there is performed a method for processing a substrate by the substrate processing apparatus, the substrate processing method for processing a substrate while rotating the substrate, with a plate surface of the substrate being oriented substantially in a horizontal direction, the substrate processing method comprising: a supporting step in which a substrate is placed on projecting members projected upward of a table, and the substrate is supported with a gap formed between the substrate and the table; an accelerating step in which the supported substrate is started to be rotated, and a rotational velocity of the substrate is accelerated; and a processing step in which the substrate is processed while the substrate is being rotated, wherein a suction of an atmosphere of the gap is performed by a pressure adjusting apparatus including a suction duct line having one end thereof being opened to the gap, and a suction mechanism connected to the suction duct line, for at least a certain period during a duration from when the supporting step is finished until when the processing step is finished. The aforementioned concrete embodiments (forms, structures, manners, and so on), which can be applied to the first embodiment of the substrate processing method, can be also applied to the method for processing a substrate that can be executed by the program stored in the first embodiment of the program storage medium.

A second embodiment of the program storage medium is executable by a control device for controlling a substrate processing apparatus, upon execution of the program by the control device, there is performed a method for processing a substrate by the substrate processing apparatus, the substrate processing method for processing a substrate while rotating the substrate, with a plate surface of the substrate being oriented substantially in a horizontal direction, the substrate processing method comprising: a supporting step in which a substrate is placed on projecting members projected upward of a table, and the substrate is supported with a gap formed between the substrate and the table; and a processing step in which the substrate is processed while the substrate is being rotated, wherein a state of the substrate is examined based on a pressure measured by a pressure monitoring apparatus including a pressure measuring duct line having one end thereof being opened to the gap and a pressure sensor connected to the pressure measuring duct line, for at least a certain period during a duration from when the supporting step is finished until when the processing step is finished. The aforementioned concrete embodiments (forms, structures, manners, and so on), which can be applied to the first embodiment of the substrate processing method, can be also applied to the method for processing a substrate that can be executed by the program stored in the second embodiment of the program storage medium.

An embodiment of the present invention will be more concretely described herebelow with reference to the drawings. In the drawings attached to this specification, a contraction scale, a dimension ration between the horizontal direction and the vertical direction, and so on are suitably modified and exaggerated from the real ones, in order to facilitate illustration and understanding.

Figure 1:
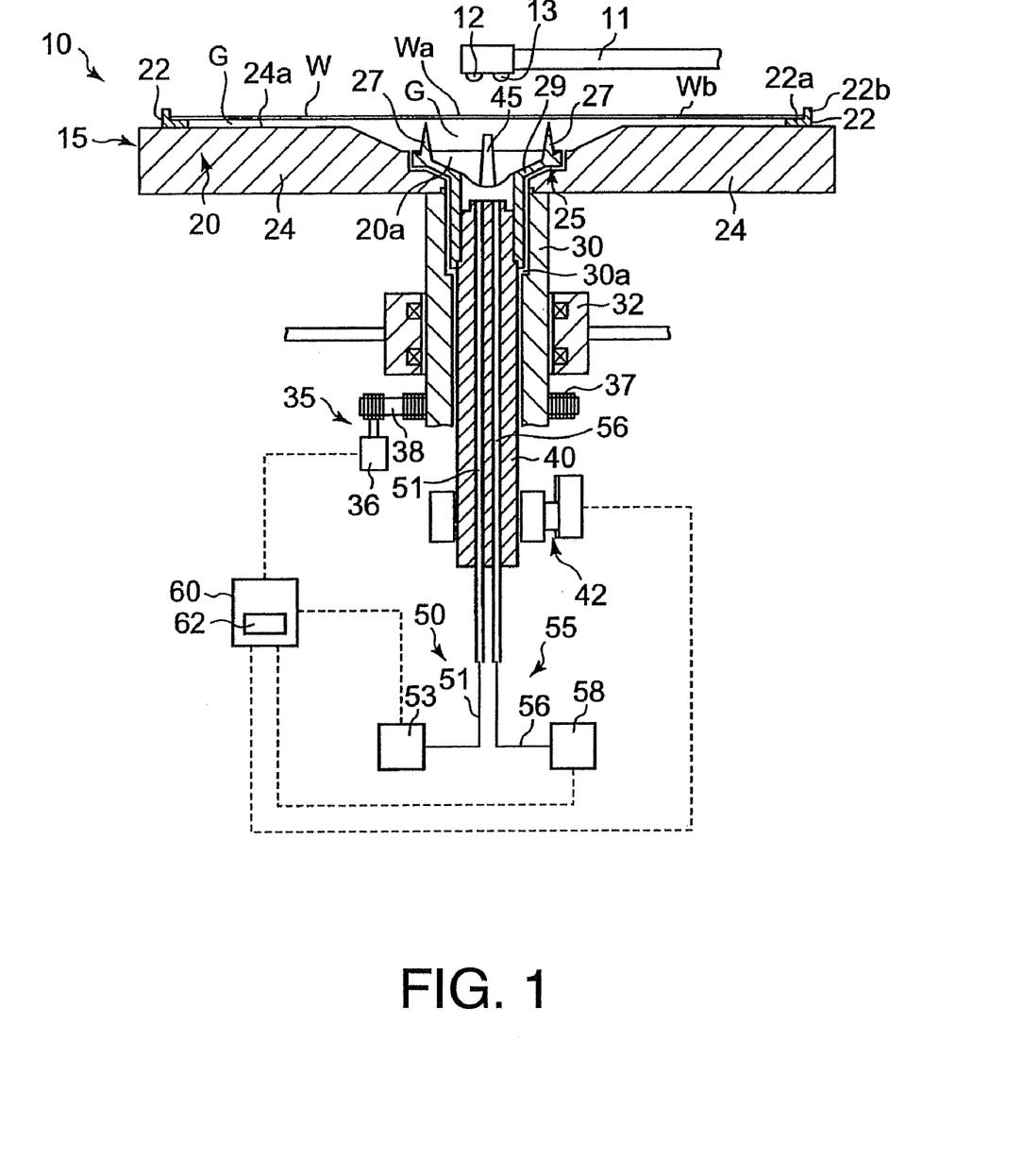
FIG. 1, which is a view for explaining an embodiment of the present invention, is a longitudinal sectional view showing a substrate processing apparatus.
Figure 2:
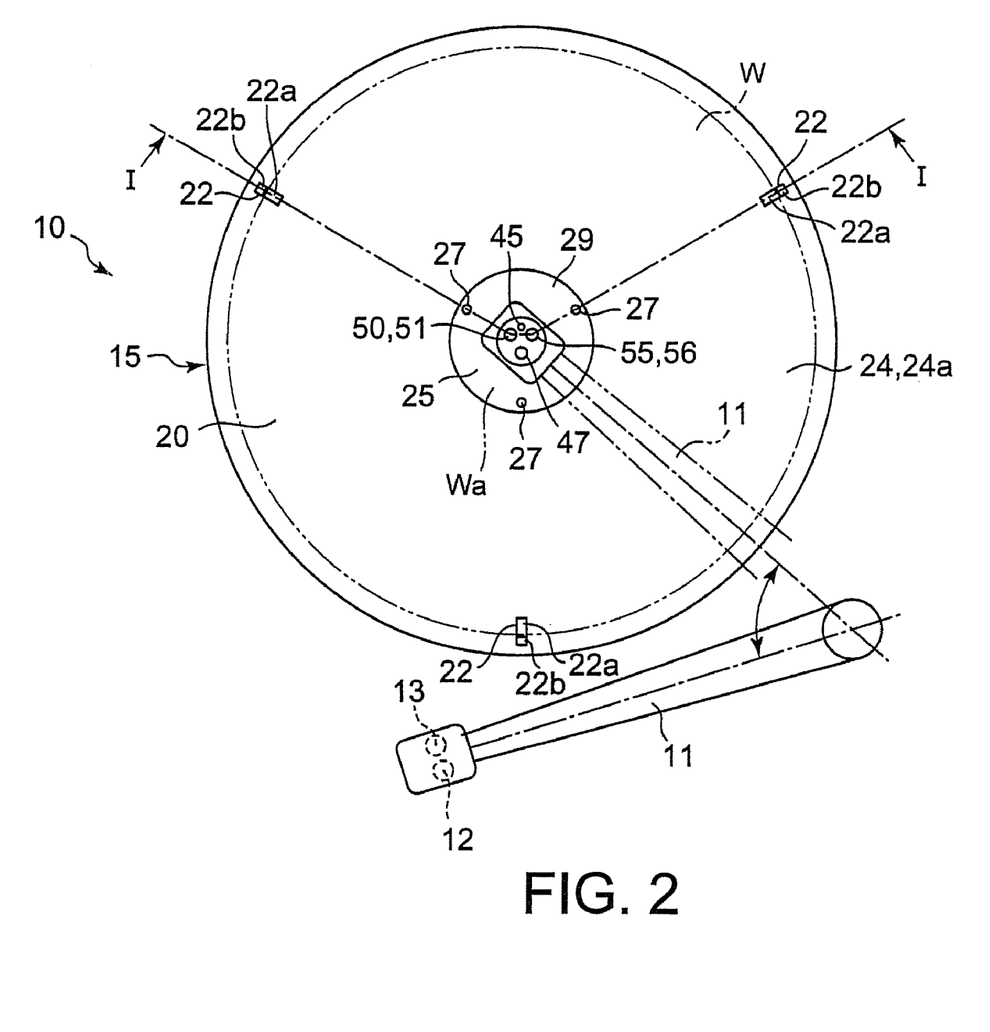
FIG. 2 is a top view showing the substrate processing apparatus shown in FIG. 1.
Figure 3:
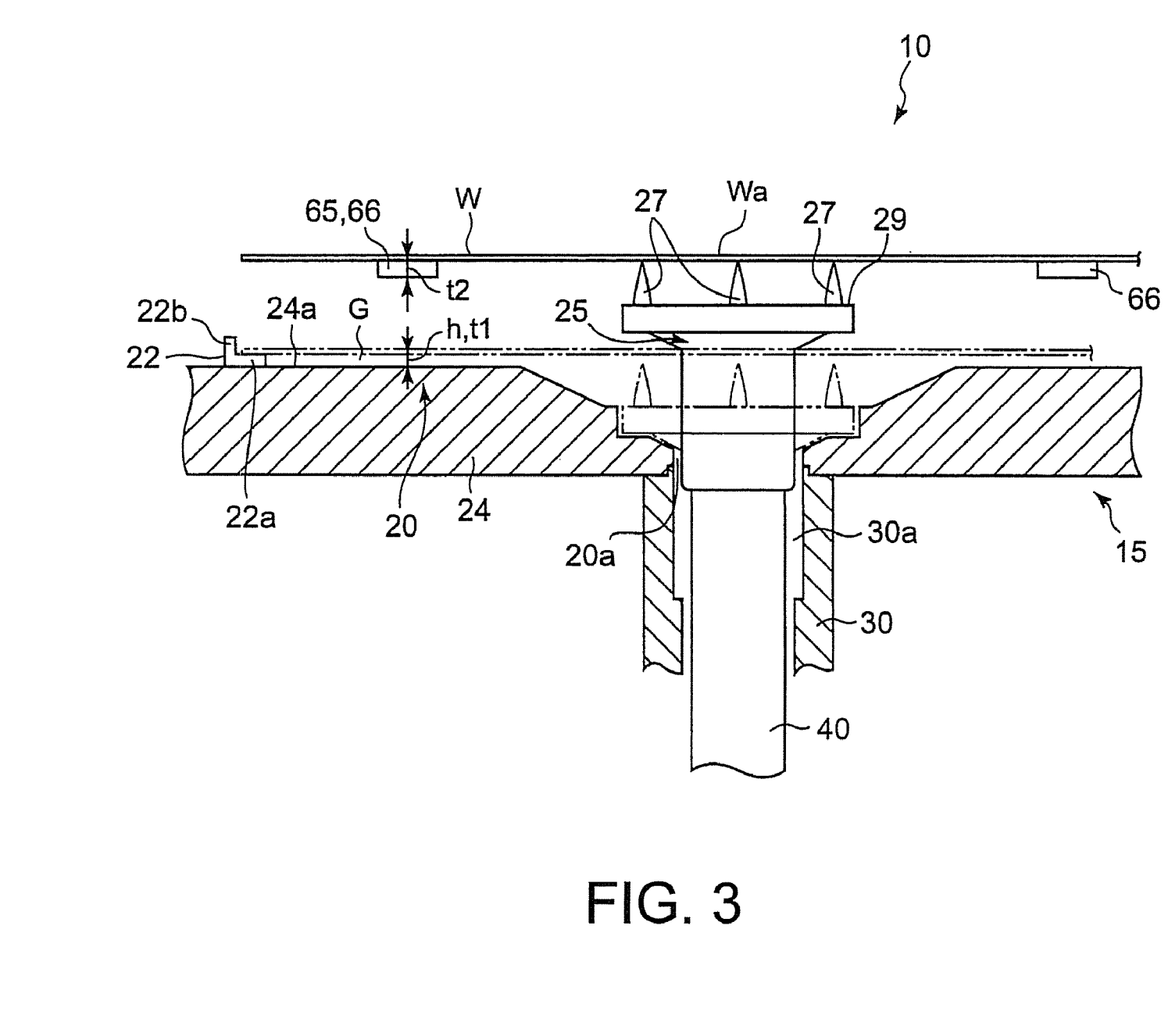
FIG. 3 is a view for explaining an operation of an elevating plate of the substrate processing apparatus shown in FIG. 1.
Figure 4:
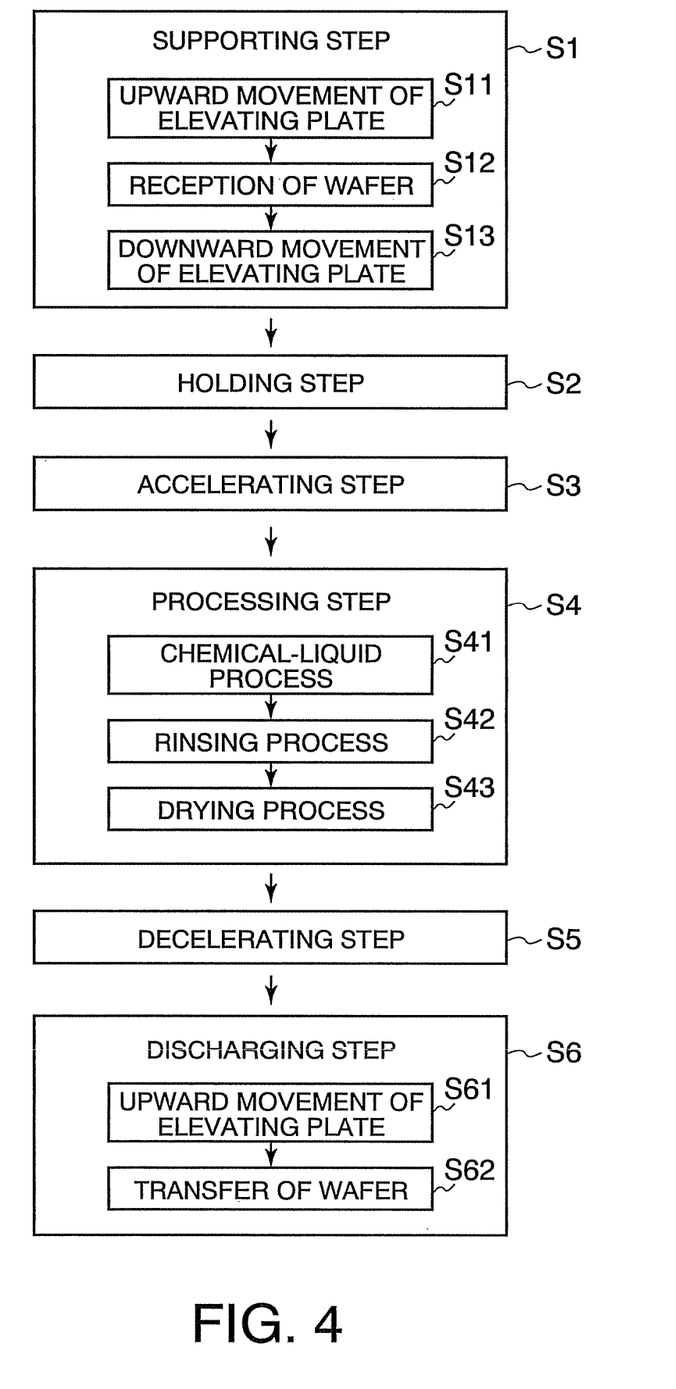
FIG. 4 is a flowchart for explaining an example of a substrate processing method that can be performed by the substrate processing apparatus shown in FIG. 1.

FIGS. 1 to 4 are views for explaining one concrete embodiment of the present invention. FIG. 1 is a longitudinal sectional view showing a substrate processing apparatus. FIG. 2 is a top view showing the substrate processing apparatus. FIG. 3 is a view for explaining an operation of the substrate processing apparatus. FIG. 4 is a flowchart for explaining a substrate processing method. The section shown in FIG. 1 corresponds to a section taken along the line I-I in FIG. 2.

In the below embodiment, there is given an example in which the substrate processing apparatus and the substrate processing method according to the present invention are applied to a case where a thin-plate like semiconductor wafer (an example of an object to be processed) having a substantially circular outer contour is cleaned. However, the substrate processing apparatus and the substrate processing method according to the present invention is not limited to the application to the cleaning of a wafer as a matter of course.

As shown in FIGS. 1 to 3, the substrate processing apparatus 10 is an apparatus that processes a wafer W while rotating the wafer W, with a plate surface (an upper surface and a lower surface) thereof being oriented along a horizontal direction. The substrate processing apparatus 10 includes a discoid table 15 that can rotatably support a wafer W with a gap (gap) G between the table 15 and the wafer W. In FIG. 2, the wafer W is shown by two-dot chain lines.

As shown in FIGS. 1 to 3, the table 15 includes, in other words, a base plate 20 having an opening (through hole) 20a formed in a part which will be opposed to a central part Wa of a wafer W, and an elevating plate 25 positioned in the opening 20a of the base plate 20. The elevating plate 25 is positioned on a central part of the discoid table 15, and will be opposed to the central part Wa of the wafer W. The base plate 20 will be opposed to an external part Wb excluding the central part Wa of the wafer W.

The base plate 20 has a plate member 24, and a plurality of projecting members 22 disposed on an upper surface 24a of the plate member 24. In the example shown in FIG. 2, three projecting members 22 are arranged with substantially identical intervals therebetween on a circumference whose center is situated on a center of the discoid table 15. Each of the projecting members 22 projected upward from the plate member 24 of the base plate 20 has a support part 22a which contact a wafer W at a peripheral part of the wafer W, and a restriction part 22b projected further upward than the support part 22a. When the support part 22a is brought into contact with a wafer W from below, the wafer W can be supported on the base plate 20 (table 15). A height h of the support part 22a may be, for example, between about 1 mm and about 10 mm. In this case, as described below, it is easier to generate a pressure variation in the gap G. As shown in FIG. 2, the restriction part 22b is positioned horizontally outside the support part 22a. In addition, as shown in FIGS. 1 and 3, the restriction part 22 is positioned horizontally outside a peripheral part of a wafer W placed on the support parts 22a. Thus, the restriction parts 22b can restrict a horizontal movement of the wafer W placed on the support parts 22a.

The elevating plate 25 has a body part 29 having an upper surface that is inclined downward toward the center of the discoid table 15, and a plurality of lift pins 27 disposed on a peripheral part of the body part 29 so as to project upward therefrom. In the example shown in FIG. 2, three lift pins 27 are arranged with substantially identical intervals therebetween on a circumference whose center is situated on the center of the discoid table 15.

As shown in FIG. 1, the substrate processing apparatus 10 further includes a rotating shaft member 30 fixedly coupled to a lower surface of the base plate 20 and extended in the vertical direction, and a rotation driving mechanism 35 coupled to the rotating shaft member 30 so as to drive the rotating shaft member 30 such that the rotating shaft member 30 rotates. As illustrated, the rotating shaft member 30 is formed to have a cylindrical shape. A hollow part 30a of the rotating shaft member 30 is in communication with the opening 20a of the base plate 20. The rotating shaft member 30 is held by a bearing 32 such that the rotating shaft member 30 can be rotated about a vertically extended shaft center. The rotation driving mechanism 35 has a pulley 37 fixed on the rotating shaft member 30 from outside, and a driving member (e.g., a motor) 36 that imparts a driving force to the pulley 37 through a driving belt 38.

In addition, as shown in FIG. 1, the substrate processing apparatus 10 further includes an elevating shaft member 40 fixedly coupled to a lower surface of the elevating plate 25 and extended in the vertical direction, and an elevation driving mechanism 42 connected to the elevating shaft member 40 so as to drive the elevating shaft member 40 such that the elevating shaft member 40 moves upward and downward. The elevating shaft member 40 is extended slidably with respect to the rotating shaft member 30, in the hollow part 30a of the cylindrical rotating shaft member 30. By the vertical driving of the elevation driving mechanism 42, the elevating plate 25 can be vertically moved between a position inside the opening 20 of the base plate 20, which is shown by the two-dot chain lines in FIG. 3, and a position above the base plate 20, which is shown by the solid line in FIG. 3.

Further, as shown in FIG. 1, the substrate processing apparatus 10 includes a pressure monitoring apparatus 50 capable of measuring a pressure of the gap G between the wafer W placed on the table 15 and the table 15, and a pressure adjusting apparatus 55 capable of adjusting the pressure of the gap G between the wafer W placed on the table 15 and the table 15.

The pressure monitoring apparatus 50 includes a pressure measuring duct line (a duct line for measuring the pressure) 51 having one end thereof being opened to the gap G at a position opposed to the central part Wa of the wafer W, and a pressure sensor 53 connected to the other end of the pressure measuring duct line 51. Only the one end and the other end of the pressure measuring duct line 51 are opened. Thus, there is substantially no possibility that an airflow is generated in the pressure measuring duct line 51 having the other end that is substantially blocked (closed) by the pressure sensor 53. For this reason, although the pressure sensor 53 is located on a position remote from an area where the one end of the pressure measuring duct line 51 is opened, a pressure of this area can be measured with a high precision. As shown in FIG. 1, the pressure measuring duct line 51 is extended in the elevating shaft member 40 and passed through a part of the elevating plate 25 which is opposed to the central part Wa of the wafer W. As a result, the one end of the pressure measuring duct line 51 is opened to a portion located between the elevating plate 25 and the wafer W in the gap G formed between the table 15 and the wafer W.

On the other hand, the pressure adjusting apparatus 55 includes a suction duct line (a duct line for sucking an atmosphere) 56 having one end thereof being opened to the gap G at a position opposed to the central part Wa of the wafer W, and a suction mechanism 58 connected to the other end of the suction duct line 56. Only the one end and the other end of the suction duct line 56 are opened. Thus, the suction mechanism 58 can suck an atmosphere in an area in which the one end of the suction duct line 56 is opened so as to adjust a pressure of this area. As shown in FIG. 1, the suction duct line 56 is extended in the elevating shaft member 40 and passed through the part of the elevating plate 25 which is opposed to the central part Wa of the wafer W. As a result, the one end of the suction duct line 56 is opened to a portion located between the elevating plate 25 and the wafer W in the gap G formed between the table 15 and the wafer W.

In addition, as shown in FIG. 2, in addition to the pressure measuring duct line 51 and the suction duct line 56, a gas supply duct line (a duct line for supplying a gas) 45 and a process-liquid supply duct line (a duct line for supplying a process liquid) 47 are passed through the elevating plate 25. Similarly to the one end of the pressure measuring duct line 51 and the one end of the suction duct line 56, one end of the gas supply duct line 45 and one end of the process-liquid supply duct line 47 are opened to the gap G between the wafer W and the table 15 at positions opposed to the central part Wa of the wafer W. Similarly to the pressure measuring duct line 51 and the suction duct line 56, the gas supply duct line 45 and the process-liquid supply duct line 47 are extended through the elevating shaft member 40.

The process-liquid supply duct line 47 is connected to a chemical liquid source from which a chemical liquid is supplied, a rinse liquid source from which a rinse liquid is supplied, a dry liquid source from which a dry liquid is supplied, and so on, via a switching valve or the like.

On the other hand, the gas supply duct line 45 is connected to a gas source from which an inert gas such as a nitrogen gas is supplied. A distal end (upper end) of the gas supply duct line 45 which is opened to the gap G is located at a position higher than upper ends of the pressure measuring duct line 51, the suction duct line 56 and the process-liquid supply duct line 47. The distal end (upper end) of the gas supply duct line 45 is located in the vicinity of the lower surface (rear surface) of the wafer W placed on the base plate 20, and is formed to have a tapered shape. Thus, a gas supplied from the gas supply duct line 45 can be supplied onto the lower surface of the wafer W before a flow velocity of the gas is decreased, i.e., at a high velocity.

In addition, as shown in FIG. 1, disposed above the table 15 are a front-side process-liquid supply part 12 that supplies a process liquid onto the upper surface (front surface) of the wafer W supported on the base plate 20 of the table 15, and a front-side gas supply part 13 that supplies a gas onto the upper surface of wafer W supported on the base plate 20 of the table 15. The front-side process-liquid supply part 12 and the front-side gas supply part 13 are supported by a moving arm 11 capable of moving above the wafer W supported on the base plate 20. As shown in FIG. 2, the moving arm 11 is made swingable, so that the moving arm 11 can locate the front-side process-liquid supply part 12 and the front-side gas supply part 13, at a position opposed to the center of the wafer W from above (two-dot chain lines in FIG. 2), at a position opposed to the peripheral part of the wafer W from above, and further at a position displaced from the upper part of the wafer W (solid line in FIG. 2). The front-side process-liquid supply part 12 is connected to a chemical liquid source from which a chemical liquid is supplied, a rinse liquid source from which a rinse liquid is supplied, a dry liquid source from which a dry liquid is supplied, and so on, via a switching valve or the like. The front-side gas supply part 13 is connected to a gas source from which an inert gas such as a nitrogen gas is supplied.

As a chemical liquid to be supplied from the process-liquid supply duct line 47 and the front-side process-liquid supply part 12, dilute hydrofluoric acid, ammonia peroxide mixture (SC1), and hydrochloric-acid peroxide mixture (SC2) may be used. In addition, from the process-liquid supply duct line 47 and the front-side process-liquid supply part 12, there may be supplied a water particularly a deionized water (DIW) as a rinse liquid. In addition, from the process-liquid supply duct line 47 and the front-side process-liquid supply part 12, there may be supplied isopropyl alcohol may be supplied as a dry liquid.

As shown in FIG. 1, the substrate processing apparatus 10 further includes a control device 60 connected to the above respective structural elements so as to control the structural elements. To be specific, the control device 60 is connected to the aforementioned rotation driving mechanism 35, the elevation driving mechanism 42, the pressure monitoring apparatus 50, the pressure adjusting mechanism 55, and the respective valves and the like, so as to control the operations of these equipments.

In particular, the control device 60 in this embodiment is configured to be capable of examining (inspecting, checking, corm, confirming) a state of a wafer W, e.g., whether the wafer W is placed or not, whether the wafer W is normally supported or not, and whether the wafer W is normally held or not, based on a pressure in the gap G which is measured by the pressure monitoring apparatus 50. More specifically, the control device 60 is configured to judge that there is a trouble about the state of the wafer W, namely, the wafer W is not placed, or the wafer W is not normally supported or held, when a pressure measured by the pressure monitoring apparatus 50 is over a predetermined value or is not less than the predetermined value which is determined based on at least whether the wafer W is rotated or not when the pressure is measured, and, if rotated, a rotational velocity (unit is rpm, for example) of the wafer W when the pressure is measured.

In addition, the control device 60 in this embodiment is configured to control, when the base plate 20 is driven so as to be rotated, a suction performed by the pressure adjusting apparatus 55 is controlled based on at least a rotational velocity of the base plate 20 driven by the rotation driving mechanism 35. More specifically, the control device 60 is configured to carry out the suction by the pressure adjusting apparatus 55, when a rotational velocity of the base plate 20 driven by the rotation driving mechanism 35 is not more than a preset rotational velocity or below the preset rotational velocity.

Connected to the control device 60 is an input and output device composed of a keyboard through which a command is inputted in order that a step manager can manage the substrate processing apparatus 10, and a display on which an operating condition of the substrate processing apparatus 10 is visually displayed. In addition, the control device 60 can access a storage medium (a storage device) 62 storing a program or the like for realizing a process carried out by the substrate processing apparatus 10. The storage medium 62 may be formed of a known program storage medium such as a memory such as a ROM and a RAM, and a disk-shaped storage medium such as a hard disk, a CD-ROM, a DVD-ROM, and a flexible disk.

Next, an example of a substrate processing method that can be achieved with the use of the substrate processing apparatus 10 as structured above is described with reference mainly to a flowchart shown in FIG. 4. The below-described operations of the respective structural elements for carrying out the substrate processing method are controlled by a control signal from the control device 60 based on the program previously stored in the program storage medium 62.

At first, a wafer W to be processed is placed on the projecting members 22 of the table 15, and the wafer W is supported on the table 15 such that a gap G is formed between the wafer W and the table 15 (S1). To be specific, as shown in FIG. 3, the wafer W to be processed is brought to a part above the table 15 by a transfer apparatus 65. At this time, the wafer W is supported on a transfer arm 66 of the transfer apparatus 65. Then, the elevating plate 25 is driven by the elevation driving mechanism 42 so as to be moved upward (S11). In the course of the upward movement, the elevating plate 25 receives the wafer W from the transfer arm 66 of the transfer apparatus 65, and the wafer W is supported by the lift pins 27 from below (S12). After the wafer W has been transferred to the elevating plate 25, the transfer arm 66 of the transfer apparatus 65 is horizontally moved outward so as to be retracted from the area above the table 15. Thereafter, the elevating plate 25 is driven by the elevation driving mechanism 42 so as to be moved downward (S13). As shown in FIG. 1, in a state where the elevating plate 25 is lowered, the distal ends of the lift pins 27 of the elevating plate 25 are located on positions lower than the distal ends of the projecting members 22 of the base plate 20. Thus, in the course of the downward movement of the elevating plate 25, the wafer W having been supported on the lift pins 27 of the elevating plate 25 is transferred on the projecting members 22 of the base plate 20. In this manner, the wafer W is supported on the table 15 with the gap G between the wafer W and the table 15.

In this embodiment, the table 15 is composed of the base plate 20 capable of being rotated and the elevating plate 25 capable of being vertically moved. Under the condition where the elevating plate 25 elevated from the base plate 20, the wafer W can be transferred between the elevating plate 25 and the transfer apparatus 65. According to this embodiment, a projecting height h of the projecting member 22 can be appropriately set, without considering a thickness t2 (see, FIG. 3) of the transfer arm 65 that supports a wafer W from below and transfers the wafer W above the table 15. Thus, the projecting height h of the projecting member 22 can be made smaller than the thickness t2 (see, FIG. 3) of the transfer arm 65, whereby a thickness t1 (see, FIG. 3) of the gap G between the wafer W supported on the projecting members 22 and the table 15 can be sufficiently thinned. As a result, as described below, it is easier to generate a pressure variation in the gap G, to thereby promote generation of a negative pressure in the gap G.

Then, the wafer W placed on the table 15 is held on the table (S2). Herein, to "hold" a wafer W means that an action for keeping the wafer W on the table 15 is positively performed, in addition to the action of gravity that is generated when the wafer W is merely placed on the table 15 (supported by the table 15 from below). To be specific, an atmosphere in the gap G formed between the wafer W and the table 15 is sucked by the pressure adjusting apparatus 55. As can be understood from FIGS. 1 and 2, the periphery of the gap G is opened. However, as described above, the thickness t1 of the gap G between the upper surface 24a of the plate member 24 of the base plate 20 and the lower surface of the wafer W, which form the periphery of the gap G, can be set thin enough. Thus, by suitably adjusting an output of the suction mechanism 58 of the pressure adjusting apparatus 55, it is possible to make lower a pressure in the gap G which is below the wafer W supported on the table 15 than a pressure which is above the wafer W. That is to say, a negative pressure can be generated in the gap G so as to suck the wafer W toward the table 15, whereby the wafer W can be stably held.

During the step S2, variation of the pressure in the gap G, more strictly, variation of the pressure in the gap G in the vicinity of the one end of the pressure measuring duct line 51 is monitored by the pressure monitoring apparatus 50. As described above, when the wafer W is normally supported by the support parts 22a of the projecting members 22, the thickness t1 of the gap G is sufficiently thinned, so that the pressure in the gap G can be lowered by the suction of the pressure adjusting apparatus 55. A behavior of the pressure variation in the gap G at this time is researched beforehand, and is previously stored in the control device 60 or the storage medium 62.

On the other hand, when the wafer W is not normally supported by the support parts 22a of the projecting members 22, the behavior of the pressure variation differs from the behavior when a wafer is normally supported. In many cases, since the wafer W is not normally supported, the thickness t1 of the gap G is increased at least a portion of the peripheral part of the wafer W, so that a lowering velocity of the pressure is delayed, or the pressure is not lowered.

During the step S2 in which the wafer W is sucked and held, the control device 60 compares the variation of the pressure measured by the pressure monitoring apparatus 50 and the previously stored behavior of the pressure variation when a wafer W is normally supported. As a result, a state of the wafer W, i.e., whether the wafer W is accurately placed on a predetermined position and is normally held or not can be checked with a high precision. When it is judged that the wafer W is not normally held, the process to the wafer W is suspended. Meanwhile, when it is confirmed that the wafer W is normally held, and it is further confirmed that the pressure in the gap G, which is measured by the pressure monitoring apparatus 50, has been lowered below a predetermined pressure or is not more than the predetermined pressure, the succeeding step S3 is started.

After the wafer W has been sucked and held on the table 15, the base plate 20 together with the wafer W is driven so as to be rotated by the rotation driving mechanism 35. Until the rotational velocity of the base plate 20 (the rotational velocity of the wafer W) reaches a preset rotational velocity (herein, a first rotational velocity), the rotation driving mechanism 35 accelerates the rotation of the base plate 20 (S3). The rotational velocity of the base plate 20 and the wafer W is measured by a tachometer, not shown, connected to the control device 60. The control device 60 monitors the rotational velocity measured by the tachometer.

During the step S3, the suction of the atmosphere in the gap G by the pressure adjusting apparatus 55 is continuously performed. While the rotational velocity of the W is being accelerated, there might be likely to occur troubles such as fluttering (jumping) of the wafer W on the projecting members 22 and sliding (shifting) of the wafer W on the projecting members 22. However, according to this embodiment, since the pressure of the gap G between the central part Wa of the wafer W and the table 15 is sufficiently lowered in the accelerating step S3 in which the rotational velocity of the wafer W is accelerated, the wafer W can be stably held on the table 15 even in the accelerating step S3 during which troubles are likely to occur.

In addition, when the wafer W and the base plate 20 are rotated, the atmosphere (gas) in the gap G is rotated about the rotational axis center of the base plate 20 because of propulsion caused by the irregularities (e.g., the projecting member 22) on the base plate 20 and friction between the gap G and the upper surface of the base plate 20 or the lower surface of the wafer W, whereby a centrifugal force of the atmosphere (gas) is generated. Namely, the gas in the gap G is relatively moved radially outward from the rotational axis center with respect to the substrate W and the rotating table 15. Thus, the pressure of the gap G between the wafer W and the table 15 becomes lower than a pressure above the wafer W. In particular, the pressure of the gap G at a position opposed to the central part Wa of the wafer W is most lowered. Especially, the faster the rotational velocity of the wafer W and the base plate 20 is, the more the pressure in the gap G is lowered. Further, the thinner the thickness t1 of the gap G between the table 15 and the wafer W is, the greater the lowering of the pressure in the gap G becomes, because the centrifugal force acts more effectively on the gas in the gap G. Thus, by increasing the rotational velocity of the wafer W and the base plate 20, the formation of the negative pressure in the gap G is promoted, whereby the wafer W can be more stably held on the table 15.

During the accelerating step S3, the monitoring of the pressure in the gap G by the pressure monitoring apparatus 50 is continuously conducted. When the wafer W has been normally placed on the table 15 in the supporting step S1, and is continuously normally held thereon in the succeeding accelerating step S3, the thickness t1 of the gap G between the table 15 and the wafer W is maintained thin, and thus the pressure in the gap G is gradually lowered in accordance with the increase in rotational velocity. A behavior of the normal pressure variation in the gap G at this time is researched beforehand, and is previously stored in the control device 60 or the storage medium 62.

On the other hand, when the wafer W is not normally held on the projecting members 22 of the table 15, the behavior of the pressure variation in the gap G differs from the behavior when a wafer is normally supported, which is similar to the holding step S2. In many cases, since the wafer W is not normally supported, the thickness t1 of the gap G is increased at least a portion of the peripheral part of the wafer W, so that a lowering velocity of the pressure is delayed, or the pressure is not lowered.

During the step S3 in which the rotational velocity is accelerated, the control device 60 compares the variation of the pressure measured by the pressure monitoring apparatus 50 and the previously stored behavior of the pressure variation when a wafer W is normally held. More specifically, the control device 60 is configured to monitor the pressure measured by the pressure monitoring apparatus 50 during the accelerating step S3, and to judge that there is a trouble, when the pressure measured by the pressure monitoring apparatus 50 is over a predetermined value (a value that is determined based on the previously stored pressure value under normal state) or is not less than the predetermined value. In this manner, it is possible to precisely check a state of the wafer W, i.e., whether the wafer W is normally held on the table 15 or not. When it is judged that the wafer W is not normally held, the process to the wafer W is suspended.

Meanwhile, after it has been confirmed that the wafer W is normally held because the pressure in the gap G is normally lowered, and the rotational velocity of the base plate 20 and the wafer W has reached the predetermined rotational velocity (first rotational velocity), the succeeding step S4 is started.

In this embodiment, after the rotational velocity of the base plate 20 and the wafer W has reached first rotational velocity, the suction by the pressure adjusting apparatus 55 is stopped. Namely, when the rotational velocity of the base plate 20 driven by the rotation driving mechanism 35 becomes not less than the first rotational velocity or exceeds the first rotational velocity, the control device 60 stops the suction by the pressure adjusting apparatus 55. Even when the suction by the pressure adjusting apparatus 55 is stopped, the rotational velocity of the base plate 20 and the wafer W is fast enough. Thus, a sufficient negative pressure can be formed in the gap G, so that it is possible to stably hold the wafer W on the table continuously.

Then, there is performed the processing step S4 in which the wafer W is processed while being rotated. In this embodiment, the processing step S4 includes a chemical-liquid processing step S41 in which a wafer W is chemically cleaned by a chemical liquid, a rinsing step S42 in which the chemically processed wafer W is rinsed by a rinse liquid (deionized water), and a drying step S43 in which the wafer W is dried.

In the chemical-liquid processing step S41, a chemical liquid is supplied onto the upper surface (front surface) and the lower surface (rear surface) of the wafer W from the front-side process-liquid supply part 12 and the process-liquid supply duct line 47, and the upper surface (front surface) and the lower surface (rear surface) of the wafer W are simultaneously processed. During the chemical-liquid processing step 41, the base plate 20 and the wafer W are continuously driven so as to be rotated by the rotation driving mechanism 35 at the first rotational velocity (e.g., 500 rpm).

Then, in the rinsing step S42, a rinse liquid is supplied onto the upper surface (front surface) and the lower surface (rear surface) of the wafer W from the front-side process-liquid supply part 12 and the process-liquid supply duct line 47, and the upper surface (front surface) and the lower surface (rear surface) of the wafer W are rinsed. During the rinsing step S42, the base plate 20 and the wafer W are continuously driven so as to be rotated by the rotation driving mechanism 35 at a second rotational velocity (e.g., 1000 rpm) that is faster than the first rotational velocity.

Thereafter, the drying step S43 is performed. As an example, the drying step 43 may include a replacement step and a spin-off step. In the replacement step, a drying liquid is supplied from the front-side process-liquid supply part 12 and the process-liquid supply dud line 47, and the rinse liquid (deionized water) remaining on the upper surface and the lower surface of the wafer W is replaced with the drying liquid. During the replacement step, the base plate 20 and the wafer W are continuously rotated at a third rotational velocity (e.g., 700 rpm) that is faster than the first rotational velocity. In the spin-off step, an inert gas is supplied from the front-side gas supply part 13 and the gas supply duct line 45, while the base plate 20 and the wafer W are being rotated at a fourth rotational velocity (e.g., 1000 rpm) that is faster than the first rotational velocity, so that the liquid remaining on the wafer W is spun off from the upper surface and the lower surface of the wafer W.

In this manner, the processing step 4 is performed to the wafer W. In this embodiment, due to the negative pressure generated in the gap G between the wafer W and the table 15 by the rotation of the wafer W and the base plate 20, the wafer W can be held on the table 15. Only the projecting members 22 are in contact with the wafer W, and, in addition, the contact area between the projecting members 22 and the wafer W can be significantly made small. Thus, an airflow around the wafer W can be effectively prevented from being disturbed during the rotation of the base plate 20. As a result, it is possible to significantly properly process the wafer W stably held on the table 15.

While the wafer W is rotated at a constant velocity in the processing step S4, the suction of the atmosphere in the gap G by the pressure adjusting apparatus 55 is stopped. However, during the processing step S4, the wafer W is rotated at relatively faster rotational velocities that are faster than the first rotational velocity. Thus, the sufficient negative pressure is generated in the gap G, so that it is possible to stably hold the wafer W on the table 15 continuously during the processing step S4.

In addition, during the processing step S4, the monitoring of the pressure in the gap G by the pressure monitoring apparatus 50 is continuously conducted. When the wafer W and the base plate 20 are rotated at substantially a constant velocity, the pressure in the gap G takes substantially a constant value. The values of the pressure in the gap G when the wafer W and the base plate 20 are rotated at the first to fourth rotational velocities are researched beforehand, and are previously stored in the control device 60 and the storage medium 62.

When the wafer W is not normally held on the projecting members 22 of the table, the thickness t1 of the gap G between the wafer W and the table 15 varies, and the pressure in the gap G also varies in accordance with the variation of the thickness t1. During the processing step S4, the control device 60 monitors the pressure measured by the pressure monitoring apparatus 50, and checks whether the holding state of the wafer W is normal or not based on a value measured by the not-shown tachometer. To be more specific, when the pressure measured by the pressure monitoring apparatus 50 is over a predetermined value, which is determined based on at least the rotational velocity of the wafer W when the pressure is measured (a value set based on the previously stored pressure value under normal state), or is not less than the predetermined value, it is judged that there is a trouble. This is because, in such a case, it can be inferred that the thickness t1 of the gap G formed between the wafer W and the table 15 is increased because some trouble has occurred such as the wafer W flutters (jumps) on the table 15 or the wafer W is displaced from the table 15. In this manner, a state of the wafer W, i.e., whether the wafer W is normally held on the table 15 or not can be precisely examined. When the holding state of the wafer W is judged to be not normal, the process to the wafer W is stopped. When it is judged that the wafer W has been processed under the normally held state, the succeeding step S5 is started.

Then, the rotational velocity of the base plate 20 and the wafer W, which have been rotated at the fourth rotational velocity until then, is decelerated (S5). During the decelerating step S5, the suction of the atmosphere in the gap G by the pressure adjusting apparatus 55 is performed. Namely, when the rotational velocity of the base plate 20 driven by the rotation driving mechanism 35 becomes not more than the fourth rotational velocity or falls below the fourth rotational velocity, the control device 60 carries out the suction by the pressure adjusting apparatus 55. Thus, even when the generation of the negative pressure in the gap G caused by the rotation of the base plate 20 and the wafer W is insufficient because of the decrease in rotational velocity of the base plate 20 and the wafer W, the sufficient negative pressure can be generated due to the suction performed by the pressure adjusting apparatus 55. As a result, it is possible to stably hold the wafer W on the table 15 continuously, in the decelerating step S5 during which troubles, such as fluttering (jumping) of the wafer W on the projecting members 22 and the slide (shift) of the wafer W on the projecting members 22, are likely to occur.

During the decelerating step S5, the monitoring of the pressure in the gap G by the pressure monitoring apparatus 50 is continuously conducted. When the wafer W is normally held on the table 15 continuously during the decelerating step S5, the pressure in the gap G is gradually increased in accordance with the decrease in rotational velocity. A behavior of the pressure variation in the gap G at this time is researched beforehand, and is previously stored in the control device 60 or storage medium 62. During the step S5 in which the rotational velocity is decelerated, the control device 60 compares the variation of the pressure measured by the pressure monitoring apparatus 50 and the behavior of the previously stored pressure variation under normal state. As a result, a state of the wafer W, namely, whether the wafer W is normally held on the table 15 or not can be precisely checked.

After the rotation of the base plate 20 and the wafer W has been stopped, the suction by the pressure adjusting apparatus 55 is stopped, and the decelerating step S5 is finished.

Thereafter, discharge of the processed wafer W is performed (S6). In the discharging step S6, the elevating plate 25 is firstly moved upward (S61). In the course of the upward movement of the elevating plate 25, the processed wafer W supported on the projecting members 22 of the base plate 20 is carried onto the lift pins 27 of the elevating plate 25. Then, the elevating plate 25 supporting the wafer W is moved up to a predetermined position, and the transfer arm 66 of the transfer apparatus 65 is extended to a lower part of the wafer W supported by the elevating plate 25. Under this state, when the elevating plate 25 is lowered, the wafer W is transferred from the elevating plate 25 to the transfer arm 66 of the transfer apparatus 65 (S62).

In this manner, a series of steps to the wafer W is completed. Then, a next wafer W to be processed is brought into the substrate processing apparatus by the transfer apparatus 65, and the same process as described above is performed to the wafer W.

According to the above illustrated embodiment, while the base plate 20 and the wafer W are being rotated, the wafer W can be sucked toward the table 15 and held thereon owing to the negative pressure generated in the gap G between the wafer W and the table 15. In addition, there is provided the pressure adjusting apparatus 55 including the suction duct line 56 having the one end being opened to the gap G between the wafer W and the table 15 at a position opposed to the central part Wa of the wafer W, and the suction mechanism 58 connected to the other end of the suction duct line 56. Thus, when the rotational velocity of the wafer W is slow, the pressure of the gap G formed between the wafer W and the table 15 can be sufficiently lowered by using the pressure adjusting apparatus 55, whereby the wafer W can be stably held on the table 15.

To be specific, during the accelerating step S3 and the decelerating step S5 in which the rotational velocity of the wafer W is accelerated or decelerated, the pressure of the gap G between the central part Wa of the wafer W and the table 15 is sufficiently lowered, so that the wafer W can be stably held on the table 15 in the accelerating step S3 and the decelerating step S5 during which troubles are likely to occur. Thus, there can be effectively prevented fluttering (jumping) of the wafer W on the table 15, which is likely to occur in the accelerating step S3 and the decelerating step S5 because of the thin plate-like shape of the wafer W, and slide (shift) of the wafer W on the table 15, which is likely to occur in the accelerating step S3 and decelerating step S5 because of the substantially circular outer contour of the wafer W.

In addition, before the rotation of the wafer W is started, it is possible to suck the wafer W toward the table 15 and hold the wafer W thereon, by sucking the atmosphere of the gap G between the wafer W supported on the table 15 and the table 15 by the pressure adjusting apparatus 55. In this case, the wafer W can be stably held even at the time immediately after the rotation of the wafer W is started, at which fluttering (jumping) of the wafer W on the table 15 and slide (shift) of the wafer W with respect to the table 15 are especially likely to occur.

The pressure adjusting apparatus 55 will not contact the wafer W, and thus will not disturb an airflow around the wafer W. Thus, an appropriate process can be performed to the wafer W that is stably held.

In addition, according to the illustrated embodiment, there is provided the pressure monitoring apparatus 50 including the pressure measuring duct line 51 having the one end being opened to the gap (gap) G between the wafer W and the table 15 at a position opposed to the central part Wa of the wafer W (a thin-plate like substrate having a circular outer contour), and the pressure sensor 53 connected to the other end of the pressure measuring duct line 51. With the use of the pressure monitoring apparatus 50, variation of the pressure of the gap G between the central part Wa of the wafer W and the table 15 during the rotation of the wafer W can be monitored. Owing to the significantly simple act of monitoring the pressure, a state of the wafer on the table 15, e.g., whether the wafer W is brought onto the table 15 or not, whether the supporting position of the wafer W is normal or not, and whether the holding state of the wafer W is normal or not, can be readily and exactly confirmed.

In addition, by monitoring the pressure of the gap G between the central part Wa of the wafer W and the table 15, a state of the wafer W can be readily and exactly examined (inspected) in the accelerating or decelerating step during which troubles are likely to occur. Thus, it can be readily and exactly detected that the holding position (supporting position) of the wafer W has been shifted, which may be caused by fluttering (jumping) of the wafer W on the table 15 during the accelerating or decelerating step because of the thin plate-like shape of the wafer W, and/or slide (shift) of the wafer W with respect to the table 15 during the accelerating or decelerating step because of the substantially circular outer contour of the wafer W.

Moreover, the pressure monitoring apparatus 50 does not need a large installation space. The pressure monitoring apparatus 50 can monitor a state of the wafer W, without being affected by scattering and/or condensation of the process liquid during the processing step.

In addition, according to the illustrated embodiment, with the use of the pressure adjusting apparatus 55, it is easier to generate a pressure variation of the gap G between the central part Wa of the wafer W that is located on the normal position and the table 15. Thus, whether the wafer W is located on the normal position on the table 15 can be more exactly examined by the pressure monitoring apparatus 50.

Further, according to the illustrated embodiment, the transfer of the wafer W can be preformed on the elevating plate 25 which is moved upward from the base plate 20. In this case, the projecting height h of the projecting member 22 can be set, without considering the thickness t2 of the transfer arm 66 that transfers the wafer W above the table 15. Thus, by appropriately setting the projecting height h of the projecting members 22, the thickness t1 of the gap G between the wafer W supported on the projecting member 22 and the wafer W can be sufficiently thinned. As a result, it is easy to generate a variation of the pressure of the gap G between the central part Wa of the wafer W and the table 15. Namely, by means of the rotation of the wafer W or the suction performed by the pressure adjusting apparatus 55, the pressure in the gap G can be greatly lowered. Thus, it is possible to more stably held the wafer W on the table 15. In addition, since it is easy to generate a variation of the pressure of the gap G between the central part Wa of the wafer W and the table 15, a state of the wafer W can be more exactly examined by using the pressure monitoring apparatus 50.

Furthermore, according to the illustrated embodiment, the projecting member 22 has the restriction part 22b which will be positioned horizontally outside the peripheral part of the wafer W. Thus, a horizontal movement of the wafer W placed on the support part 22a of the projecting member 22 can be restricted by the restriction part 22b. Therefore, the wafer W can be stably held on the table 15.

It is possible to variously modify the aforementioned embodiment. Herebelow, an example of the modification is described.

For example, in the above embodiment, there has been described the case where the pressure monitoring apparatus 50 and the pressure adjusting apparatus 55 are combined. However, not limited thereto, only one of the pressure monitoring apparatus 50 and the pressure adjusting apparatus 55 may be used. As one example, when the pressure adjusting apparatus 55 is used, whether a state of the wafer W, which is held on the table 15 by the generation of the negative pressure caused by the rotation and the suction of the atmosphere in the gap G by the pressure adjusting apparatus 55, is normal or not may be examined by using an optical sensor (typically photoelectric sensor). In addition, when the pressure monitoring apparatus 50 is used, a mechanical chuck mechanism that mechanically holds (mechanically chucks) a wafer W on the table may be disposed W on the table, and whether a state of the wafer W, which is held on the projecting members 22 by the mechanical chuck system, is normal or not may be examined, based on the pressure in the gap G which is measured by the pressure monitoring apparatus 50.

In addition, in the above embodiment, there has been described the example in which the suction of the atmosphere in the gap G by the pressure adjusting apparatus 55 is conducted throughout the durations of the accelerating step S3 and the decelerating step S5. However, not limited thereto, the suction by the pressure adjusting apparatus 55 may be conducted only a part of the duration of the accelerating step S3 or a part of the duration of the decelerating step S5. As one example, while the rotational velocity of the wafer W (base plate 20) is not less than a preset rotational velocity (e.g., 400 rpm) or is over the preset rotational velocity, the suction by the pressure adjusting apparatus 55 may be stopped. Under this control, the suction by the pressure adjusting apparatus 55 is conducted during a certain period including the start of the acceleration in the accelerating step S3, and during a certain period including the finish of the deceleration in the decelerating step S5. In addition, when the rotational velocity of the substrate is slow, the substrate tends to be stably held. Thus, the suction of the pressure adjusting apparatus 55 may be stopped from when the rotation of the substrate is started until when the rotational velocity of the substrate exceeds a predetermined value or becomes not less than the predetermined value.

Further, in the above embodiment, there has been described the example in which the suction by the pressure adjusting apparatus 55 is stopped throughout the duration of the processing step S4. However, not limited thereto, the suction by the pressure adjusting apparatus 55 may be conducted during the chemical-liquid processing step S41 in which the rotational velocity of the wafer W (base plate 20) tends to be relatively decreased, for example. Thus, it is possible to more stably hold the wafer W.

Further, in the above embodiment, there has been described the example in which the suction by the pressure adjusting apparatus 55 is not conducted during the supporting step S1. However, not limited thereto, the suction by the pressure adjusting apparatus 55 may be conducted during the supporting step S1, in particular, during the downward movement of the elevating plate 25 supporting a wafer W. In this case, owing to the suction by the pressure adjusting apparatus 55, it is possible to guide the wafer W such that the wafer W can be exactly located on a predetermined position. Alternatively, the suction by the pressure adjusting apparatus 55 may be conducted during the supporting step S1, and whether the wafer W is located on a predetermined position or not my be conducted based on a variation of the pressure which is measured by the pressure monitoring apparatus 50 before and after the placement of the wafer W. In a case wherein the wafer W is placed on the table 15 while the suction by the pressure adjusting apparatus 55 is being conducted, after the wafer W has been exactly located on a predetermined position on the table 15 with a predetermined thin gap G formed between the wafer W and the table 15, the pressure in the gap G largely varies before and after the placement of the wafer W. Thus, based on the variation of the pressure measured by the pressure monitoring apparatus 50, whether the wafer W is exactly supported on the predetermined position on the table 15 can be readily and exactly confirmed.

Further, in the above embodiment, there has been described the example in which the control device 60 controls the suction performed by the pressure adjusting apparatus 55 and the stop thereof based on the rotational velocity of the base plate 20. However, not limited thereto, the control device 60 may control the suction by the pressure adjusting apparatus 55 and the stop thereof based on the pressure in the gap G, for example. Specifically, the control device 60 may carry out the suction by the pressure adjusting apparatus 55, when the pressure in the gap G is over a preset pressure or is not less than the preset pressure. Alternatively, the control device 60 may control the suction by the pressure adjusting apparatus 55 and the stop thereof based on the rotational velocity and a result of the measured pressure. As described above, the holding of the substrate tends to be stable when the rotational velocity is slow. Thus, when the rotational velocity of the substrate is not more than a predetermined value or is below the predetermined value, the suction by the pressure adjusting apparatus 55 may not be conducted even when the pressure in the gap G is high.

Further, in the above embodiment, there has been described the example in which the table 15 is composed of the base plate 20 and the elevating plate 25. However, not limited thereto, the table 15 may be formed of a discoid base plate without the opening (through hole) 20*a*, for example. Further, the elevating plate 25 and the elevating shaft member 40 may be removed from the substrate processing apparatus 10 in the above illustrated embodiment. In this example, the pressure measuring duct line 51 and/or the suction duct line 56 may be extended through the rotating shaft member 30 and passed through a part of the discoid base plate which will be opposed to a central part Wa of a wafer W, and one end of the pressure measuring duct line 51 and/or one end of the suction duct line 56 may be opened to the gap G positioned between the discoid base plate and the central part Wa of the wafer W. In addition, in the supporting step of the above embodiment, the substrate to be processed may be directly transferred to and directly placed on the elevating plate 25.

Further, in the above embodiment, there has been described the example in which the elevating plate 25 supports the wafer W from below when the elevating plate 25 is moved upward. However, not limited thereto, the elevating plate 25 may be constructed to adsorb the wafer W from below when the elevating plate 25 is moved upward, for example.

Further, in the above embodiment, there has been described the example in which the one end of the pressure measuring duct line 51 and the one end of the suction duct line 56 are opened to the gap G at a position opposed to a central part (a center and a vicinity of the center) Wa of a wafer (substrate) W. However, not limited thereto, the one end of the pressure measuring duct line 51 and the one end of the suction duct line 56 may be opened to the gap G at a position other than the central part Wa, e.g., at a position near to the central part Wa.

Some modifications of the above embodiment have been described, and these modifications can be naturally combined with each other.

In the above description, there is shown the example in which the substrate processing apparatus according to the present invention is applied to the apparatus for cleaning a wafer W. However, not limited thereto, the substrate processing apparatus according to the present invention may be applied to a substrate processing apparatus for cleaning and drying a substrate such as an LCD substrate and a CD substrate, and also may be applied to various processes other than the cleaning process.

What is claimed is:

1. A substrate processing apparatus configured to process a substrate while rotating the substrate, with a plate surface of the substrate being oriented substantially in a horizontal direction, the substrate processing apparatus comprising:
a table including a rotatable base plate having projecting members projected upward, the table being capable of supporting a substrate such that the projecting members contact the substrate from below with a gap being formed between the substrate and the table;
a rotation driving mechanism configured to rotate the base plate;
a pressure adjusting apparatus including a suction duct line having one end thereof being opened to the gap and a suction mechanism connected to the suction duct line; and
a control device configured to control a suction performed by the pressure adjusting apparatus while the one end of the suction duct line is spaced apart from the substrate and the substrate is supported on the projecting members of the base plate and rotated with the base plate by the rotation driving mechanism,
wherein the control device is connected to the rotation driving mechanism and the pressure adjusting apparatus, and is configured to control the suction performed by the pressure adjusting apparatus based on at least a rotational velocity of the base plate rotated by the rotation driving mechanism, and
wherein the control device is configured to perform the suction by the pressure adjusting apparatus when the rotational velocity of the base plate rotated by the rotation driving mechanism is not more than a preset rotational velocity, and the control device is configured to stop the suction by the pressure adjusting apparatus when the rotational velocity of the base plate is more than the preset rotational velocity.

2. The substrate processing apparatus according to claim 1, further comprising a pressure monitoring apparatus including a pressure measuring duct line having one end thereof being opened to the gap and a pressure sensor connected to the pressure measuring duct line.

3. The substrate processing apparatus according to claim 2, wherein the control device is configured to examine a state of the substrate, based on a pressure in the gap which is measured by the pressure monitoring apparatus.

4. The substrate processing apparatus according to claim 3, wherein the control device is configured to judge that the substrate is not correctly supported when the pressure measured by the pressure monitoring apparatus is more than a predetermined value that is determined based on at least a rotational velocity of the substrate at the time the pressure is measured.

5. The substrate processing apparatus according to claim 1, wherein
the base plate has an opening formed in a position opposed to the substrate, and the table further includes an elevating plate positioned in the opening of the base plate,
the substrate processing apparatus further comprises: a rotating shaft member that is connected to the base plate and is connected to the rotation driving mechanism such that the rotation driving mechanism can rotate the rotating shaft member, the rotating shaft member having a hollow part in communication with the opening of the base plate; an elevating shaft member extended slidably with respect to the rotating shaft member in the hollow part of the rotational shaft member, the elevating shaft member being connected to the elevating plate; and an elevation driving mechanism connected to the elevating shaft member such that the elevation driving mechanism can move the elevating shaft member upward and downward, and
the suction duct line is extended in the elevating shaft member, and the one end of the suction duct line is opened to the gap positioned between the elevating plate and the substrate.

6. The substrate processing apparatus according to claim 1, further comprising a rotating shaft member that is connected to the base plate, and is connected to the rotation driving mechanism such that the rotation driving mechanism can rotate the rotating shaft member,
wherein the suction duct line is extended in the rotating shaft member, and the one end of the suction duct line is opened to the gap positioned between the base plate and the substrate.

7. The substrate processing apparatus according to claim 1, wherein
each of the projecting members includes a support part that is configured to contact a peripheral part of the substrate from below, and a restriction part projected further upward than the support part so as to be positioned on a lateral side of the peripheral part of the substrate.

8. The substrate processing apparatus according to claim 1, wherein the elevating plate moves only up and down.

9. The substrate processing apparatus according to claim 3, wherein the control device is configured to judge that the state of the substrate is not correctly supported when the pressure measured by the pressure monitoring apparatus is not less than a predetermined value that is determined based on at least a rotational velocity of the substrate at the time the pressure is measured.

10. A substrate processing apparatus configured to process a substrate while rotating the substrate, with a plate surface of the substrate being oriented substantially in a horizontal direction, the substrate processing apparatus comprising:
a table including a rotatable base plate having projecting members projected upward, the table being capable of supporting a substrate such that the projecting members contact the substrate from below with a gap being formed between the substrate and the table;
a rotation driving mechanism configured to rotate the base plate;
a pressure adjusting apparatus including a suction duct line having one end thereof being opened to the gap and a suction mechanism connected to the suction duct line; and
a control device configured to control a suction performed by the pressure adjusting apparatus while the one end of the suction duct line is spaced apart from the substrate and the substrate is supported on the projecting members of the base plate and rotated with the base plate by the rotation driving mechanism,
wherein the control device is connected to the rotation driving mechanism and the pressure adjusting apparatus, and is configured to control the suction performed by the pressure adjusting apparatus based on at least a rotational velocity of the base plate rotated by the rotation driving mechanism, and
wherein the control device is configured to perform the suction by the pressure adjusting apparatus when the rotational velocity of the base plate rotated by the rotation driving mechanism is less than the preset rotational velocity, and the control device is configured to stop the suction by the pressure adjusting apparatus when the rotational velocity of the base plate is not less than the preset rotational velocity.

11. A substrate processing method for processing a substrate while rotating the substrate, with a plate surface of the substrate being oriented substantially in a horizontal direction, the substrate processing method comprising:
a supporting step in which a substrate is placed on projecting members projected upward from a rotatable base plate of a table, and the substrate is supported with a gap formed between the substrate and the table;
an accelerating step in which the supported substrate is started to be rotated, and a rotational velocity of the substrate is accelerated; and
a processing step in which the substrate is processed while the substrate is being rotated,
wherein a suction of an atmosphere of the gap is performed by a pressure adjusting apparatus including a suction duct line having one end thereof being opened to the gap and a suction mechanism connected to the suction duct line, for at least a certain period during a duration from when the supporting step is finished until when the processing step is finished,
wherein a control device is provided and configured to control a suction performed by the pressure adjusting apparatus while the one end of the suction duct line is spaced apart from the substrate and the substrate is supported on the projecting members and rotated with the base plate by a rotation driving mechanism,
wherein the control device is connected to the rotation driving mechanism and the pressure adjusting apparatus, and is configured to control the suction performed by the pressure adjusting apparatus based on at least a rotational velocity of the base plate rotated by the rotation driving mechanism, and
wherein the control device is configured to perform the suction by the pressure adjusting apparatus when the rotational velocity of the base plate rotated by the rotation driving mechanism is less than the preset rotational velocity, and the control device is configured to stop the suction by the pressure adjusting apparatus when the rotational velocity of the base plate is not less than the preset rotational velocity.

12. The substrate processing method according to claim 11, further comprising a holding step in which the suction of the atmosphere of the gap is performed by the pressure adjusting apparatus so that the substrate is sucked toward the table and held thereon, the holding step being performed after the supporting step and before the accelerating step.

13. The substrate processing method according to claim 11, wherein
the suction by the pressure adjusting apparatus is stopped, for at least a certain period during a duration of the processing step.

14. The substrate processing method according to claim 11, wherein:
the processing step includes a plurality of processing steps of performing different processes to the rotating substrate; and
the suction by the pressure adjusting apparatus is stopped during at least one of the plurality of processing steps.

15. The substrate processing method according to claim 11, wherein
a state of the substrate is examined based on a pressure measured by a pressure monitoring apparatus including a pressure measuring duct line having one end thereof being opened to the gap and a pressure sensor connected to the pressure measuring duct line, for at least a certain period during a duration from when the supporting step is finished until when the processing step is finished.

16. The substrate processing method according to claim 15, wherein
the examination of the state of the substrate is judged that there is a trouble, when the pressure measured by the pressure monitoring apparatus is over a predetermined value that is determined based on at least the rotational velocity of the substrate at the time the pressure being measured, or is not less than the predetermined value.

17. A storage medium storing a program executable by a control device for controlling a substrate processing apparatus, upon execution of the program by the control device, there is performed a method for processing a substrate by the substrate processing apparatus, the substrate processing method for processing a substrate while rotating the substrate, with a plate surface of the substrate being oriented substantially in a horizontal direction, the substrate processing method comprising:
a supporting step in which a substrate is placed on projecting members projected upward from a rotatable base plate of a table, and the substrate is supported with a gap formed between the substrate and the table;
an accelerating step in which the supported substrate is started to be rotated, and a rotational velocity of the substrate is accelerated; and
a processing step in which the substrate is processed while the substrate is being rotated,
wherein a suction of an atmosphere of the gap is performed by a pressure adjusting apparatus including a suction duct line having one end thereof being opened to the gap and a suction mechanism connected to the suction duct line, for at least a certain period during a duration from when the supporting step is finished until when the processing step is finished,
wherein the control device is configured to control a suction performed by the pressure adjusting apparatus while the one end of the suction duct line spaced apart from the substrate and the substrate is supported on the projecting members and rotated with the base plate by a rotation driving mechanism,
wherein the control device is connected to the rotation driving mechanism and the pressure adjusting apparatus, and is configured to control the suction performed by the pressure adjusting apparatus based on at least a rotational velocity of the base plate rotated by the rotation driving mechanism, and
wherein the control device is configured to perform the suction by the pressure adjusting apparatus when the rotational velocity of the base plate rotated by the rotation driving mechanism is not more than a preset rotational velocity, and the control device is configured to stop the suction by the pressure adjusting apparatus when the rotational velocity of the base plate is more than the preset rotational velocity.

18. The program storage medium according to claim 17, wherein
in the method for processing a substrate, a state of the substrate is examined based on a pressure measured by a pressure monitoring apparatus including a pressure measuring duct line having one end thereof being opened to the gap, and a pressure sensor connected to the pressure measuring duct line, for at least a certain period during a duration from when the supporting step is finished until when the processing step is finished.

19. A substrate processing method for processing a substrate while rotating the substrate, with a plate surface of the substrate being oriented substantially in a horizontal direction, the substrate processing method comprising:

a supporting step in which a substrate is placed on projecting members projected upward from a rotatable base plate of a table, and the substrate is supported with a gap formed between the substrate and the table;

an accelerating step in which the supported substrate is started to be rotated, and a rotational velocity of the substrate is accelerated; and a processing step in which the substrate is processed while the substrate is being rotated, wherein a suction of an atmosphere of the gap is performed by a pressure adjusting apparatus including a suction duct line having one end thereof being opened to the gap and a suction mechanism connected to the suction duct line, for at least a certain period during a duration from when the supporting step is finished until when the processing step is finished, wherein a control device is provided and configured to control a suction performed by the pressure adjusting apparatus while the one end of the suction duct line is spaced apart from the substrate and the substrate is supported on the projecting members and rotated with the base plate by a rotation driving mechanism, wherein the control device is connected to the rotation driving mechanism and the pressure adjusting apparatus, and is configured to control the suction performed by the pressure adjusting apparatus based on at least a rotational velocity of the base plate rotated by the rotation driving mechanism, and wherein the control device is configured to perform the suction by the pressure adjusting apparatus when the rotational velocity of the base plate rotated by the rotation driving mechanism is less than the preset rotational velocity, and the control device is configured to stop the suction by the pressure adjusting apparatus when the rotational velocity of the base plate is not less than the preset rotational velocity.

20. A storage medium storing a program executable by a control device for controlling a substrate processing apparatus, upon execution of the program by the control device, there is performed a method for processing a substrate by the substrate processing apparatus, the substrate processing method for processing a substrate while rotating the substrate, with a plate surface of the substrate being oriented substantially in a horizontal direction, the substrate processing method comprising:

a supporting step in which a substrate is placed on projecting members projected upward from a rotatable base plate of a table, and the substrate is supported with a gap formed between the substrate and the table;

an accelerating step in which the supported substrate is started to be rotated, and a rotational velocity of the substrate is accelerated; and a processing step in which the substrate is processed while the substrate is being rotated, wherein a suction of an atmosphere of the gap is performed by a pressure adjusting apparatus including a suction duct line having one end thereof being opened to the gap and a suction mechanism connected to the suction duct line, for at least a certain period during a duration from when the supporting step is finished until when the processing step is finished, wherein the control device is configured to control a suction performed by the pressure adjusting apparatus while the one end of the suction duct line is spaced apart from the substrate and the substrate is supported on the projecting members and rotated with the base plate by a rotation driving mechanism, wherein the control device is connected to the rotation driving mechanism and the pressure adjusting apparatus, and is configured to control the suction performed by the pressure adjusting apparatus based on at least a rotational velocity of the base plate rotated by the rotation driving mechanism, and wherein the control device is configured to perform the suction by the pressure adjusting apparatus when the rotational velocity of the base plate rotated by the rotation driving mechanism is less than the preset rotational velocity, and the control device is configured to stop the suction by the pressure adjusting apparatus when the rotational velocity of the base plate is not less than the preset rotational velocity.

\* \* \* \* \*